(12) United States Patent
Kloppenburg

(10) Patent No.: US 9,620,898 B2
(45) Date of Patent: Apr. 11, 2017

(54) TEST PLUG BLOCK

(71) Applicant: PHOENIX CONTACT GMBH & CO. KG, Blomberg (DE)

(72) Inventor: Christian Kloppenburg, Büren Wewelsburg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 15/036,527

(22) PCT Filed: Oct. 22, 2014

(86) PCT No.: PCT/EP2014/002859
§ 371 (c)(1),
(2) Date: May 13, 2016

(87) PCT Pub. No.: WO2015/070946
PCT Pub. Date: May 21, 2015

(65) Prior Publication Data
US 2016/0294116 A1 Oct. 6, 2016

(30) Foreign Application Priority Data
Nov. 15, 2013 (DE) .......................... 10 2013 019 066

(51) Int. Cl.
H01R 13/627 (2006.01)
H01R 13/629 (2006.01)
H01R 9/26 (2006.01)

(52) U.S. Cl.
CPC ..... H01R 13/62944 (2013.01); H01R 9/2666 (2013.01); H01R 2201/20 (2013.01)

(58) Field of Classification Search
CPC ..................... H01R 13/6271; H01R 13/6275
(Continued)

(56) References Cited

U.S. PATENT DOCUMENTS 4,472,764 A * 9/1984 Richard ............... H01R 9/2625
361/775
5,332,397 A * 7/1994 Ingalsbe ................ H01R 31/06
439/456

(Continued)

FOREIGN PATENT DOCUMENTS

DE  10 2008 054 950 A1  6/2010
EP   0 825 684 A1        2/1998
EP   1 921 715 A2        5/2008

Primary Examiner — Phuong Dinh
(74) Attorney, Agent, or Firm — David S. Safran

(57) ABSTRACT

A test plug block for plugging onto a series terminal block has a plurality of interconnected test plugs and two securing parts which are arranged on both sides of the plurality of test plugs having a plug-in portion and which are connected to each other via a handle. Plugging of the test plug block onto the series terminal block is simplified in that each plug-in portion of the securing parts has two latching elements which, together with corresponding counter latching elements of the securing clamps determine a first latched position and a second latched position of the securing parts in the securing clamp, wherein the two latched positions are arranged one behind the other in the plug-on direction of the test plug block. An unlocking element is movably arranged in the housing of each securing part from a base position into first and second unlocking positions by rotating the handle.

15 Claims, 8 Drawing Sheets

(58) Field of Classification Search
USPC .................................................. 439/352, 482
See application file for complete search history.

(56) References Cited

U.S. PATENT DOCUMENTS

| | | | | |
|---|---|---|---|---|
| 6,341,972 B1* | 1/2002 | Odorfer | ............... | H01R 13/582 |
| | | | | 439/352 |
| 6,530,799 B2* | 3/2003 | Regnier | ............... | H01R 13/639 |
| | | | | 439/352 |
| 6,945,801 B2* | 9/2005 | Brown | ................ | H01R 13/641 |
| | | | | 439/188 |
| 7,666,037 B2 | 2/2010 | Diessel | | |
| 7,833,044 B2* | 11/2010 | Bouchan | ............ | H01R 13/6273 |
| | | | | 439/352 |
| 8,968,021 B1* | 3/2015 | Kennedy | ............ | H01R 13/6273 |
| | | | | 439/352 |
| 8,998,654 B2* | 4/2015 | Donhauser | ............. | H01R 13/02 |
| | | | | 439/709 |
| 9,153,916 B2 | 10/2015 | Schloo et al. | | |
| 9,396,889 B1* | 7/2016 | Chen | .................... | H01H 9/0271 |
| 9,476,909 B2* | 10/2016 | Kloppenburg | ....... | H01R 9/2666 |
| 2015/0077149 A1 | 3/2015 | Kloppenburg | | |

\* cited by examiner

TEST PLUG BLOCK

BACKGROUND OF THE INVENTION

Field of the Invention

The invention relate to a test plug block for slipping onto a modular terminal block, with a plurality of interconnected test plugs and two fastening parts which are located on either side of the plurality of test plugs and which are connected to one another via a handle, the fastening parts each having a housing with a plug-in section which can be plugged into a receiving section which is made in the clip housing of a mounting clip of the modular terminal block.

Description of Related Art

Electrical modular terminals have been known for decades and are used in the millions in the wiring of electrical installations and devices. The terminals are generally latched onto mounting rails which for their part are often located in a plurality in a switchgear cabinet. In switching, measurement and control engineering, feed-through terminals with a disconnect possibility are the standard. The disconnect possibility which is implemented in these feed-through terminals by the formation of a disconnect in the current bar makes it possible to plug different plugs with different functions into the terminal housing of the modular terminal which then make contact with the current bar at the disconnect. Plugs can be in addition to simple disconnect plugs and feed-through connectors in particular also test plugs which can have special components and which enable checking of proper operation of the circuit which is connected to the modular terminal.

Electrical modular terminals which are generally made disk-shaped are often mated to several other electrical modular terminals to form a modular terminal block and are latched onto a mounting rail or are mounted in a wall cutout, for example of a switchgear cabinet. Accordingly the individual test plugs which correspond in their width in general to the width of the modular terminals are connected into a test plug block and are jointly placed on a corresponding modular terminal block. In this case it is required that the number of interconnected modular terminals and the number of test plugs which are combined with one another to form a test plug block can be freely selected. But at the same time, the test plugs which have been combined to form a test plug block should be jointly actuated as simply as possible i.e., they can be slipped jointly onto the modular terminal block.

German Patent Application DE 10 2006 052 894 A1 and corresponding U.S. Pat. No. 7,666,037 B2 disclose a modular terminal, a test plug and a test plug block which is composed of a plurality of modular terminals which are located next to one another and a corresponding number of test plugs. By using two mounting clips and two fastening parts which each are located on either side of the modular terminal block or the test plug block, the number of modular terminals and the number of test plugs which can be combined to form a modular terminal block and a test plug block respectively can be freely selected. The two fastening parts are connected to one another via a handle so that the test plug block together with the two fastening parts can be easily and comfortably plugged into or slipped onto the modular terminal block and the two mounting clips using the handle. The handle is located on the top end of the fastening parts which have a greater height than the test plugs so that the handle bridges the test plugs which are located between the two fastening parts and in this way it can be easily grasped with one hand.

In order to ensure defined contact states when the test plug is plugged into the test opening, in the electric modular terminal known from German Patent Application DE 10 2006 052 894 A1 and corresponding U.S. Pat. No. 7,666,037 B2, the current bars are made such that they form two contact regions which are located behind one another in the slip-on direction of a test plug. Thus, in the known modular terminals, the disconnect formed by the end regions of the busbars is made two-stage. Making a defined second contact region which is located in front of the first contact region in the insertion direction of the contact plug ensures that when the contact plug is inserted, first a reliable electrical connection between the contact plug and the two current bars is formed before the first contact region is opened as the contact plug continues to be inserted, as a result of which the two current bars are then electrically disconnected from one another.

The above described known modular terminals and test terminal block share the feature that the two current bars make contact with one another so that the conductor connection elements are connected to one another in an electrically conductive manner when a plug has not been inserted into the modular terminal. If conversely a plug is (fully) plugged into the modular terminal, the contact region is interrupted so that the conductor connection elements are also electrically disconnected from one another.

Often the individual test plugs of the test plug block have contact plugs of different length. When the test plug block is slipped on, first the longer contact plugs of individual test plugs dip into the corresponding openings in the terminal housing of the modular terminals and make contact there with the leading contact region of the two current bars which is first in the slip-on direction of the test plugs. When the test plug block is slipped further onto the modular terminal block, the longer contact plugs dip into the second contact region, as a result of which this contact region is opened so that the electrically conductive connection between the two current bars and thus also between the two conductor connection elements which are connected to the current bars is interrupted. If the contact plugs are electrically conductive, in this way the current being carried via the test plug is diverted. If the test plug block is slipped further onto the modular terminal block, next the shorter contact plugs make contact first of all according to the leading contact region in the modular terminals before the shorter contact plugs also open the second contact region and in this way the current being carried by these modular terminals is interrupted and optionally diverted via the test plugs.

When the test plug is being pulled out of the modular terminal block, in many applications it is necessary or at least desirable for the longer contact plugs to still interrupt the contact region of the assigned modular terminals, while the shorter contact plugs are already pulled out of the second contact region of the assigned modular terminals so that the two current bars of the corresponding modular terminal again make contact, as a result of which the current is carried via the modular terminal. But here, in the known test plug blocks, there is the risk that by pulling the test plug block out of the modular terminal block too quickly or unevenly, the above described sequence, according to which the contact regions of some modular terminals are still opened by the longer contact plugs while a current transfer is taking place via other modular terminals to which the test plugs with shorter contact plugs are assigned, is not reliably or perfectly ensured. In this way an unstable or undefined electronic state of individual modular terminals of the modular terminal block can arise.

SUMMARY OF THE INVENTION

Therefore, the object of this invention is to devise a test plug block in which the aforementioned disadvantages are avoided. Moreover the handling of the test plug block, in particular slipping the test plug block onto the modular terminal block, will be as simple and comfortable as possible for a technician.

This object is achieved in the initially described test plug block of the initially mentioned type by the plug-in section of at least one fastening part having at least two latching elements which with corresponding opposed latching elements of the mounting clip together fix a first latching position and a second latching position of the fastening part in the mounting clips, the two latching positions being arranged behind one another in the slip-on direction of the test plug block. The execution of the latching elements which are made preferably as latching hooks enables two latching positions, as a result of which the test plug block can be locked both in its fully slipped-on position and also in a second, partially pulled-out position. The second latching position can ensure that the test plug block is first pulled out of the modular terminal block only so far that shorter contact plugs of individual test plugs no longer open the contact regions of the assigned modular terminals, while the contact regions of other modular terminals are still opened by the longer contact plugs of the test plugs which are assigned to these modular terminals.

In order to enable intentional unlocking of the two latching positions, moreover in the housing of at least one fastening part an unlocking element is movably arranged which can be moved by a rotary motion of the handle out of a base position into a first unlocking position and into a second unlocking position, in the first unlocking position locking of the first latching position and in the second unlocking position locking of the second latching position being released by the unlocking element. If the unlocking element is moved into the first unlocking position, the locking between the latching elements and the opposed latching elements is released so that the test plug block can be pulled somewhat out of the modular terminal block. Since the pulling of the test plug block out of the modular terminal block is limited by the second latching position, to completely pull out the test plug block first the unlocking element must be moved into the second unlocking position, as a result of which the second latching position is released so that then the test plug block can be pulled completely out of the modular terminal block.

That the movement of the unlocking element is produced by the rotary motion of the handle makes it possible to unlock the two latching positions and remove the test plug block from the modular terminal block with only one hand and without reaching around; this makes handling especially easy for the technician. The conversion of the intentional rotary motion of the handle into translational motion of the unlocking element can take place for example by means of an eccentric drive via which the handle is connected to the unlocking element.

The handling of the test plug block, in particular slipping the test plug block onto the modular terminal block, is further facilitated for a technician by at least one fastening part having at least one limiting element which limits the possible rotation of the handle relative to the housing.

As was mentioned at the beginning, a modular terminal block composed of several modular terminals which are located next to one another and two mounting clips which are located on either side of the modular terminals is generally latched onto a mounting rail which is fastened in a switchgear cabinet. Alternatively, such a modular terminal block can also be inserted directly in one corresponding opening in one wall of the cabinet. In both applications the test plug block is generally slipped horizontally onto the modular terminal block, for which a user holds the test plug block as claimed in the invention with one hand on the handle and then slips it onto the modular terminal block with a horizontal slip-on motion.

In particular, when the test plug block has a somewhat larger number of test plugs, due to the inherent weight of the test plug block it can happen that the front of the test plug block facing away from the handle tips over due to its own weight when the user is holding the test plug block in place on the handle, i.e., the test plug block can tilt clockwise around the axis of rotation of the handle. This tilting of the test plug block would make it more difficult to simply slip the test plug block onto the modular terminal block with only one hand, since then a simple horizontal slip-on motion in which the test plug block is being held in place with only one hand on the handle would no longer be possible. That in the test plug block as claimed in the invention at least one fastening part has at least one limiting element which limits the rotary motion of the handle avoids the risk of the above described unintentional tilting of the test plug block around the axis of rotation of the handle when slipping it on; thus mechanical self-holding is accomplished. The user can simply hold the test plug block in place with one hand on the handle and slip it onto the modular terminal block by a horizontal motion.

In addition to the unintentional tilting of the front of the test plug block around the axis of rotation of the handle, the execution of the limiting element also prevents unintentional movement of the unlocking elements in the housing of the two fastening parts so that the unlocking elements are not in an undefined position when the test plug block is being slipped onto the modular terminal block.

The limiting element can be for example a relatively strong spring element, in particular a spherical compression spring whose spring force opposes an unintended rotary motion of the handle relative to the housing and thus tilting of the test plug block due to its own weight. However in the housing of the fastening part there are preferably at least one stop and one corresponding counter stop as limiting elements, the stop being located securely in the housing and the counter stop being coupled to the rotary motion of the handle. If the handle is in its base position, the counter stop adjoins the stop so that the front of the test plug block cannot tilt down if the technician is holding the test plug block in place on the handle and slipping it horizontally onto the modular terminal block.

In order to convert the rotary motion of the handle into a linear motion of at least one unlocking element, according to one advantageous configuration of the invention in the housing of at least one fastening part there is a gear train arrangement via which the unlocking element is connected to the handle. For this reason in the housing of at least one fastening part there are preferably two gear wheels which engage one another and one connecting rod, the first gear wheel being connected to the handle and the connecting rod being connected on one end to the second gearwheel, and on the other end to the unlocking element. Moreover, an advantageous power ratio can be achieved by a suitable choice of the two gear wheels.

According to one preferred configuration of the invention, in the housing of at least one fastening part at least one stop is made which interacts with a corresponding counter stop made on the first gear wheel or on the second gear wheel so that the possible rotation of the handle relative to the housing is limited when the counter stop adjoins the stop. Basically a counter stop which corresponds to the stop can be made both on the first gear wheel and also on the second gear wheel. Moreover, it is also possible for one counter stop to be made on each of the two gear wheels. But preferably the counter stop is made only on the first gear wheel which interacts directly with the handle. In the following description of this invention it is therefore always assumed that the counter stop is made on the first gear wheel, without the invention being limited to this.

So that the stop made in the housing does not hinder intentional rotary motion of the handle, the stop made in the housing and the counter stop made on the first gear wheel are located in a first plane and the teeth of the gear wheel are located in second plane which is offset to the first plane in the direction of the axis of rotation of the gear wheel. This ensures that the teeth of the gear wheel can move past the stop while the counter stop strikes the stop in the corresponding rotary position of the handle and of the gear wheel.

According to one preferred configuration of the invention, in the housing of at least one fastening part two stops are made which each interact with the counter stop made on the first gear wheel in a certain rotary position of the gear wheel. This can further limit the possible rotary motion of the handle relative to the housing, for example to rotary motion of less than 180° or preferably to rotary motion of less than 120°.

Alternatively to the execution of two stops in the housing of at least one fastening part, two counter stops can also be made on one gear wheel, then depending on the rotary position of the gear wheel one counter stop or the other strikes the first or second side of the stop. Likewise it is also fundamentally possible for a corresponding limitation of the possible rotary motion of the handle to be ensured by the two gear wheels each having one counter stop and two stops being formed in the housing, the first stop interacting with the counter stop of the first gear wheel and the second stop interacting with the counter stop of the second gear wheel. For reasons of production technology and space however, in general it will be advantageous if one counter stop is made only on one gear wheel, preferably the first gear wheel, and two stops are made in the housing, the counter stop striking the first stop in a first rotary position of the gear wheel and striking the second stop in a second rotary position.

According to another advantageous configuration of the invention, the unlocking element is made and located within the housing of the fastening part such that the unlocking element can be moved not only into a first unlocking position and into a second unlocking position, but moreover can also be moved out of the first unlocking position further into a third unlocking position. The unlocking element is positioned in the housing such that when the test plug block is slipped onto the modular terminal block, the lower edge of the unlocking element in the first unlocking position is seated on the top of the clip housing of the mounting clip. In this position, if the unlocking element is moved out of the first unlocking position in the slip-on direction of the fastening part further into the third position, the housing of the fastening part is repelled away from the clip housing of the mounting clip. In this configuration of the unlocking element it acts not only to unlock the two latching positions, but also as an ejection or removal aid when the test plug block is being pulled out of the modular terminal block.

In the above described configuration of the test plug block and the fastening part, the unlocking element can be moved by rotation of the handle by an angle α in a first direction in the housing out of a base position into the first unlocking position. By continuing to turn the handle by an angle β in the same direction the unlocking element can then be moved into the third position and by turning the handle back into the base position it can be moved into the second unlocking position.

The angles α and β by which the handle is turned in the first two steps are chosen such that the handle can be easily and comfortably turned by the technician with one hand. This two-stage turning of the handle by preferably less than 120°, for example by roughly 90°, can be done very easily and comfortably with one hand without reaching around being necessary. The angles α and β can be essentially the same, for example each can be roughly 45°. But likewise it is also possible for the two angles α and β to be different, for example angle α is roughly 20° to 40° and angle β is roughly 50° to 70°.

In the test plug block as claimed in the invention the two stops made in the housing and the counter stop made on the gear wheel are arranged such that the counter stop in the base position of the unlocking element adjoins the first stop and in the third position of the unlocking element adjoins the second stop. By making two stops in the housing and one counter stop on the gear wheel, the handling of the test plug block is further simplified for the user since the two stop positions simply dictate for the user the required angle of rotation of the handle for correct unlocking and simple removal of the test plug block from the modular terminal block.

According to another especially preferred configuration of the invention which can also be provided independently of the implementation of a limiting element, the unlocking element is located in the housing of at least one fastening part such that the unlocking element is in its base position when the handle is not actuated. This ensures that the unlocking element is always in its base position when the user is not turning the handle of the test plug block.

This can be accomplished especially easily in that in the housing of at least one fastening part which has an unlocking element, there is at least one spring element arranged such that the unlocking element is moved into its base position by the spring force of the spring element when the handle is not actuated. When the user turns the handle, the unlocking element is moved against the spring force of the spring element.

In order to prevent canting of the unlocking element, there are preferably two spring elements, a simple and space-saving arrangement being possible by the use of two compression springs which are each supported with their one end on one stop on the unlocking element and with their other end on a bearing section in the housing.

It was stated above that the plug-in section of at least one fastening part has two latching elements and that in the housing of at least one fastening part one unlocking element is movably arranged and there is a gear train arrangement consisting of two gear wheels and one connecting rod. Even if it is fundamentally possible for only one fastening part to be made accordingly, according to the preferred configuration of the test plug block as claimed in the invention both fastening parts are made accordingly so that they implement the intended two-stage latching and their unlocking by means of one unlocking element at a time.

To do this, first the plug-in sections of the two fastening parts each have two latching elements. Moreover in the housing of the two fastening parts there are also preferably one unlocking element and one gear train arrangement consisting of two gear wheels and one connecting rod at a time. If the two fastening parts each have one unlocking element, it is preferably provided that in the housing of the two fastening parts there is also at least one spring element by which the respective unlocking element is exposed to a force which moves the unlocking element into its base position if the handle part is not turned accordingly. The execution of the two fastening parts which is the same with respect to latching and unlocking ensures that canting cannot occur when slipping on and especially when removing the test plug block from the modular terminal block.

The above described prevention of the unintended tilting of the front of the test plug block when the test plug block is being guided onto the modular terminal block can conversely also be reliably achieved when a limiting element, in particular at least one stop which interacts with a corresponding counter stop on a gear wheel, is made only in the housing of one fastening part. Of course, it is however also possible for the two fastening parts to also be [sic] with respect to the execution of the limiting element, i.e., the two fastening parts preferably each have at least one stop and one counter stop.

So that a user can unambiguously and more easily recognize the respective plug-in position of the test plug block, i.e., the respective position of the plug-in section in the housing, according to one advantageous development of the test plug block as claimed in the invention it is provided that there is a position indication in the housing of at least one fastening part. The position indication can be made simply as a mechanical indication by its having a position rod and a position wheel, one section of the position rod which is provided with teeth interacting with one section of the position wheel which is provided with teeth. The position rod is movably arranged on the unlocking element, the possible direction of movement of the position rod running parallel to the slip-on direction of the test plug block. Moreover in the unlocking element on the side facing away from the handle an opening is made through which the free end of the position rod which points in the slip-on direction of the test plug block can protrude. To indicate the respective position of the plug-in section of the fastening part in the clip housing of a mounting clip, in the housing of the fastening part a viewing window is moreover made through which an indication section of the position wheel is visible from outside the housing.

The position wheel is turned accordingly by the position of the position rod, which position is dependent on the respective position of the plug-in section of the fastening part in the clip housing of a mounting clip, the position of the position wheel being recognizable through the viewing window. The indication section of the position wheel for this purpose preferably has at least three markings which can be for example different color markings or different numbers or letters. The first marking is then located in the region of the viewing window when the plug-in section of the fastening part is not plugged in the clip housing of a mounting clip or at least not latched in it so that it can be pulled completely out of the clip housing. The second marking can be recognized through the viewing window when the plug-in section of the fastening part is fully plugged in the clip housing of the mounting clip. If the plug-in section of the fastening part is in its second latching position, the third marking is located in the region of the viewing window.

Finally, according to one further advantageous configuration of the test plug block as claimed in the invention, in the housing of at least one fastening part there is a plug-in cycle counter which displays the number of plug-in cycles of the test plug into a modular terminal block. The plug-in cycle counter can for example have a mechanical counting mechanism which can be read off from the outside via a viewing window in the housing of the fastening part, the mechanical counting mechanism being able to be actuated by a rod which is movably located in the housing or in the unlocking element and whose free end protrudes out of the housing. Whenever the test plug block is being slipped on the modular terminal block, the rod is pressed into the interior of the housing, as a result of which the counting mechanism is actuated each time.

In particular, at this point there are a host of possibilities for configuring and developing the test plug block as claimed in the invention. For this purpose reference is made to the following description of one preferred exemplary embodiment in conjunction with the drawings.

DETAILED DESCRIPTION OF THE INVENTION

Figure 1:
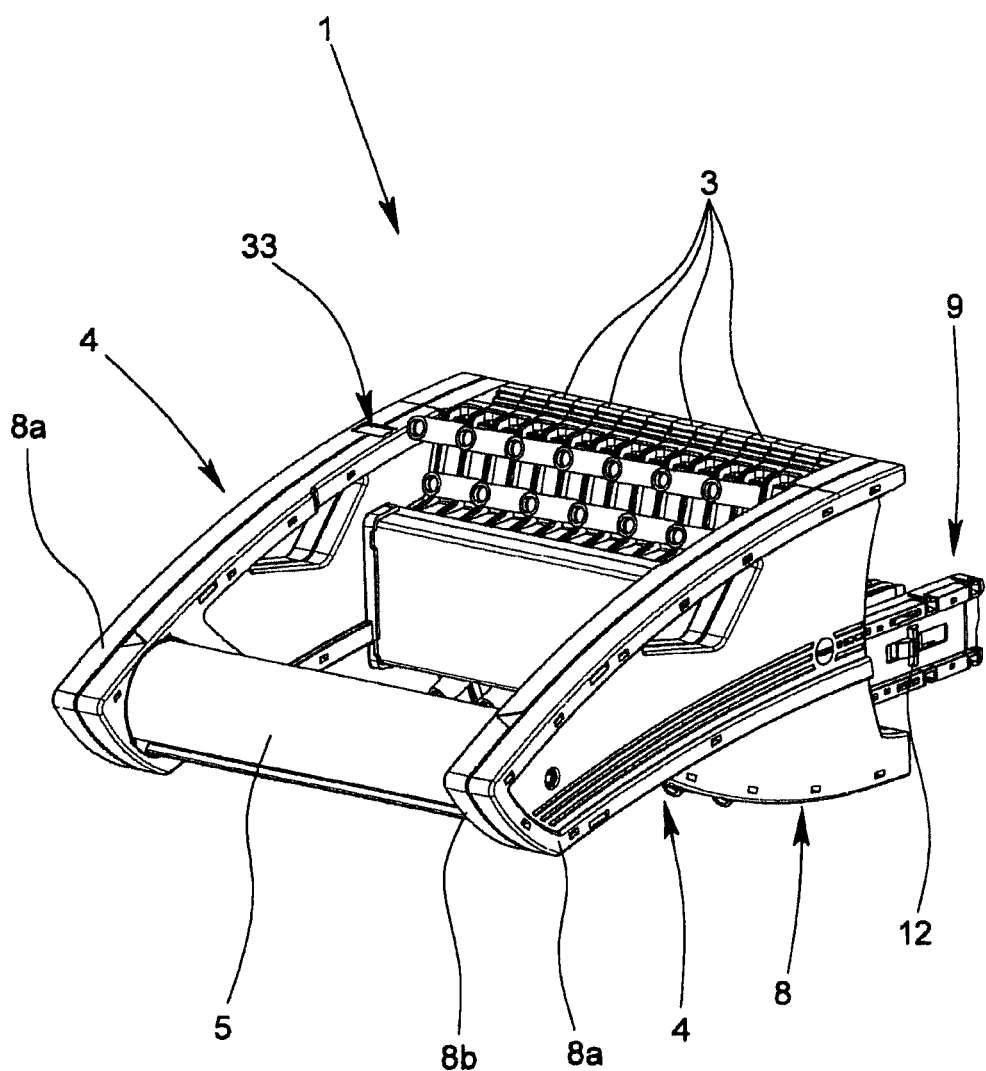
FIG. 1 is a perspective of a test plug block in accordance with the invention.
Figure 2:
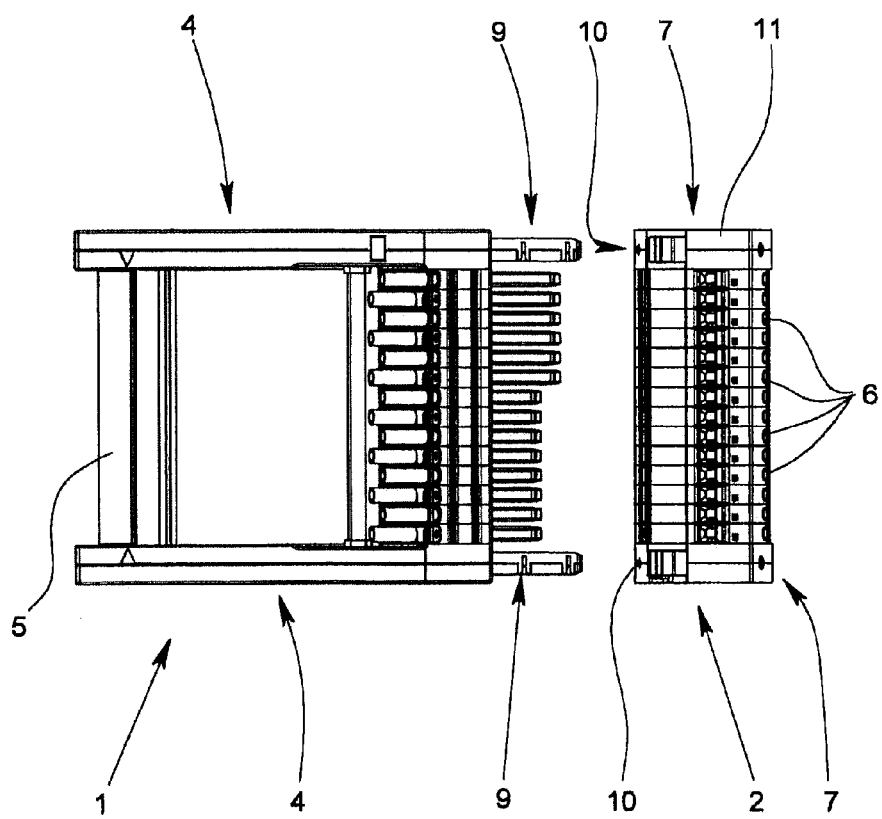
FIG. 2 shows a test plug block and a modular terminal block.

The test plug block 1 shown in a perspective in FIG. 1 is designed to be slipped onto a modular terminal block 2 (FIG. 2), and the modular terminal block 2 can be fastened, for example, on a mounting rail. The test plug block 1 is formed of a plurality of interconnected test plugs 3 and two fastening parts 4 which are located on either side of the plurality of test plugs 3. Moreover the test plug block 1 has another handle 5 via which the two fastening parts 4 are connected to one another, the height of the two fastening parts 4 being much greater than the height of the test plugs 3 so that a technician can comfortably grip the test plug block 1 on the handle 5 and can slip it onto the modular terminal block 2.

The modular terminal block 2 for its part is formed of a plurality of modular terminals 6 which are located next to one another and two mounting clips 7 which are located on either side of the plurality of modular terminals 6. As is apparent from FIG. 2, the number of test plugs 3 corresponds to the number of modular terminals 6.

Figure 3:
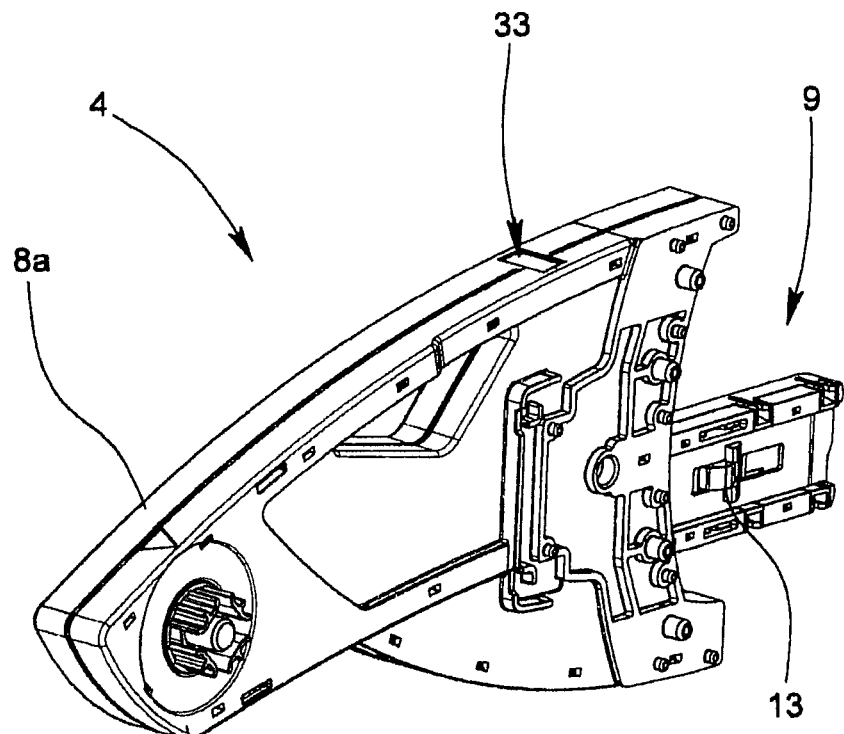
FIG. 3 is a perspective of a fastening part of the test terminal block according to FIG. 1.

The fastening part 4 shown separately in FIG. 3 has a housing 8 which is formed of two housing half-shells 8a, 8b, in the representation of the fastening part 4 in FIGS. 4 to 10, one housing half-shell 8b being omitted so that the internal structure of the fastening part 4 can be recognized. To slip the test plug block 1 on the modular terminal block 2, the two fastening parts 4 each have a plug-in section 9 which can be plugged into a corresponding receiving section 10 in the clip housing 11 of the two mounting clips 7.

As is apparent from a combined view of FIGS. 1 and 3, on the plug-in section 9 on the two sides which are opposite one another there are two latching elements 12, 13 which are each formed by two latching hooks. The latching elements 12, 13 together with two corresponding opposed latching elements in the mounting clips 7 form a first and a second latching position of the fastening part 4 in the mounting clip 7, the two latching positions being located behind one another in the slip-on direction of the test plug block 1. Of the two opposed latching elements which are made as latching clips and which are likewise provided on opposite sides in the clip housing 11, only one opposed latching element 14 is recognizable in FIGS. 7 to 10.

Figure 4:
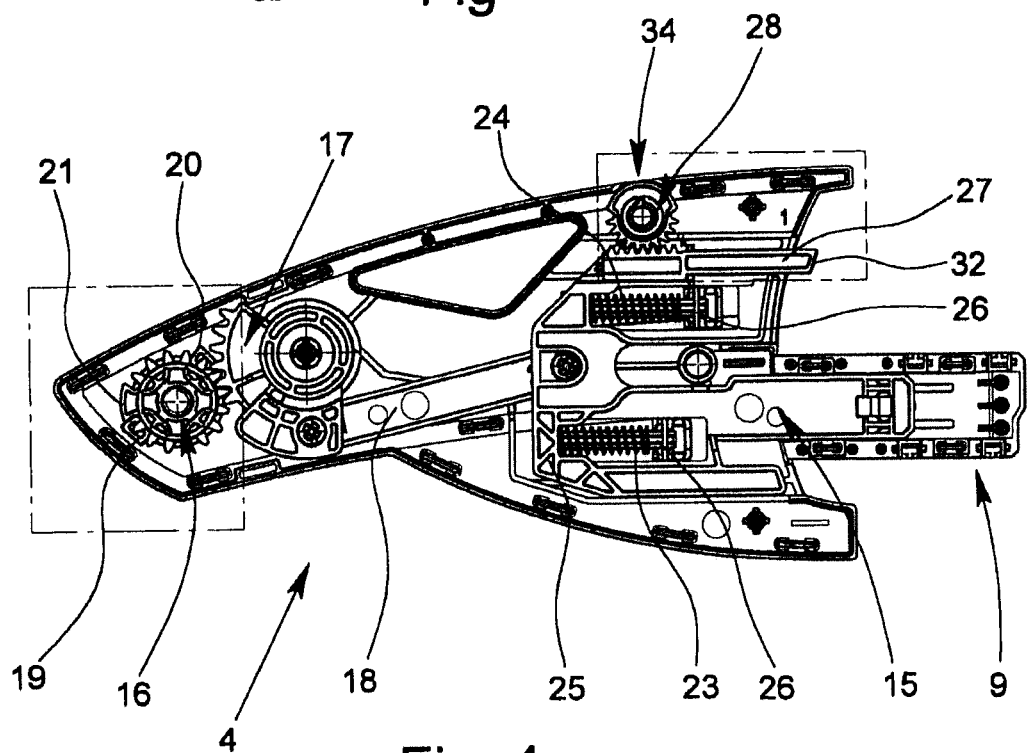
FIG. 4 shows the fastening part according to FIG. 3, with the housing opened.
Figure 8:
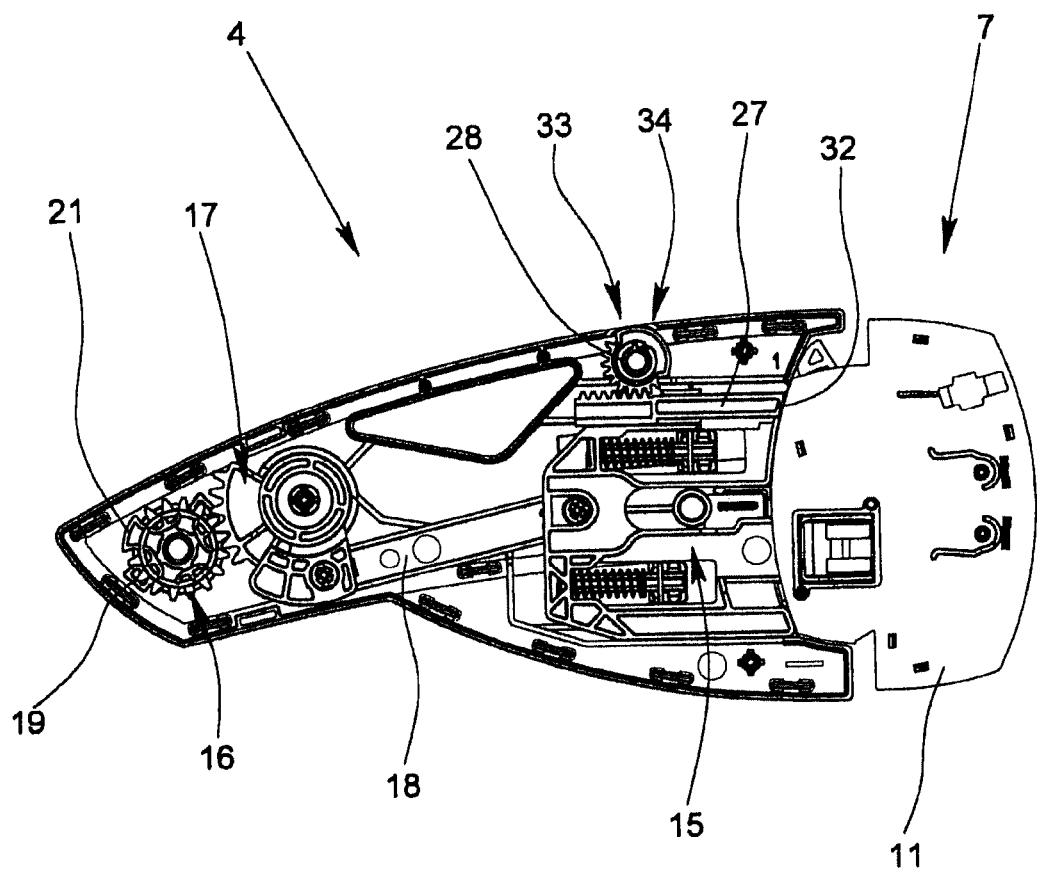
Figure 9:
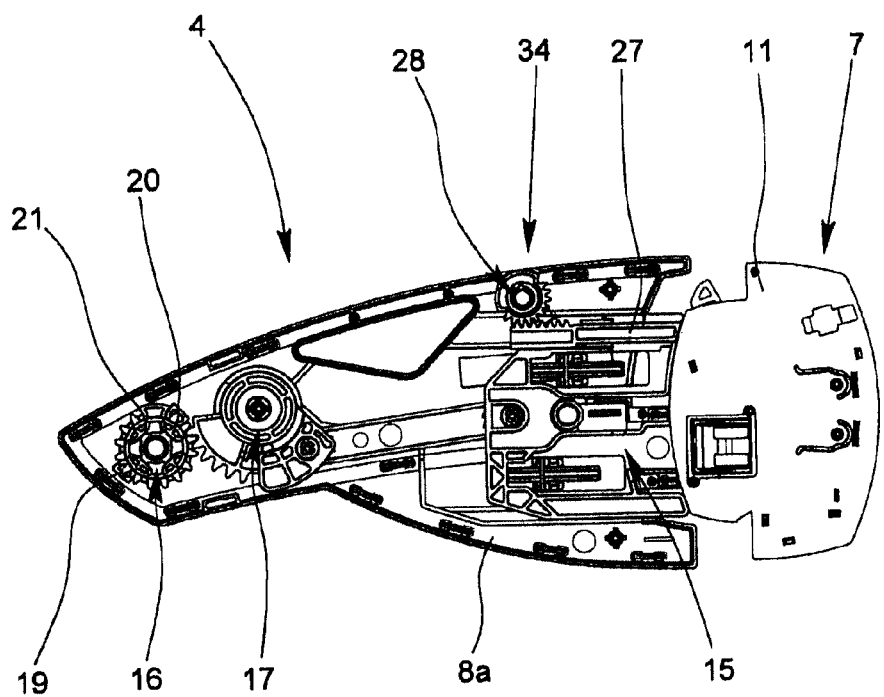
FIG. 9 shows the mounting clip and the fastening part, in the slipped-on state, in the second position.
Figure 10:
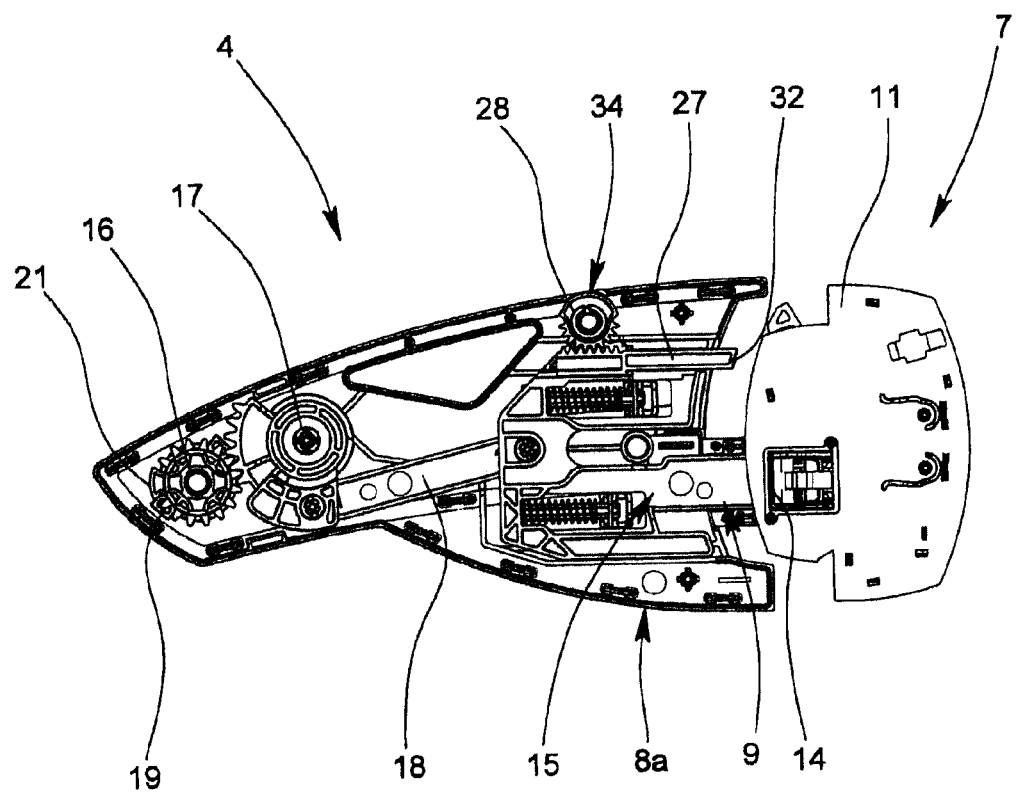
FIG. 10 shows the fastening part and a mounting clip, in the partially removed state.

As is apparent in particular from FIG. 4 and from FIGS. 7 to 10, in the housing 8 of the actuating part 4 an unlocking element 15 is movably located which can be moved by a rotary motion of the handle 5 out of a base position (FIGS. 4, 7) into a first unlocking position (FIG. 8) and a second unlocking position (FIG. 10). The unlocking element 15 is used to release the locking of the two latching positions, for which the unlocking element 15 in the first unlocking position releases the locking of the first latching position and in its second unlocking position releases the locking of the second latching position by the respective latching clip in the clip housing 11 of the mounting clip 7 being deflected, so that the corresponding latching element 12, 13 is no longer locked by the corresponding opposed latching element. With respect to one possible specific advantageous configuration of the latching elements and the opposed latching elements as well as of the unlocking element, reference is made to commonly owned, subsequently published, German Application DE 10 212 017 429 and its counterpart U.S. Patent Application Publication 2015/077149, which disclose a very similar locking and unlocking mechanism.

In order to convert the rotary motion of the handle 5 into a horizontal motion of the unlocking element 15 at the alignment of the test plug block 1 which is shown in the figures, there are two gear wheels 16, 17 which engage one another and one connecting rod 18 in the housing 8. The first gear wheel 16 is coupled to the handle 5 so that a rotary motion of the handle 5 leads to a corresponding rotary motion of the first gear wheel 16. The connecting rod 18 is connected on one end to the second gear wheel 17 and on an opposite end to the unlocking element 15 so that a rotary motion of the handle 5 via the two gear wheels 16, 17 and the connecting rod 18 leads to a horizontal movement of the unlocking element 15 in the housing 8.

Figure 5:
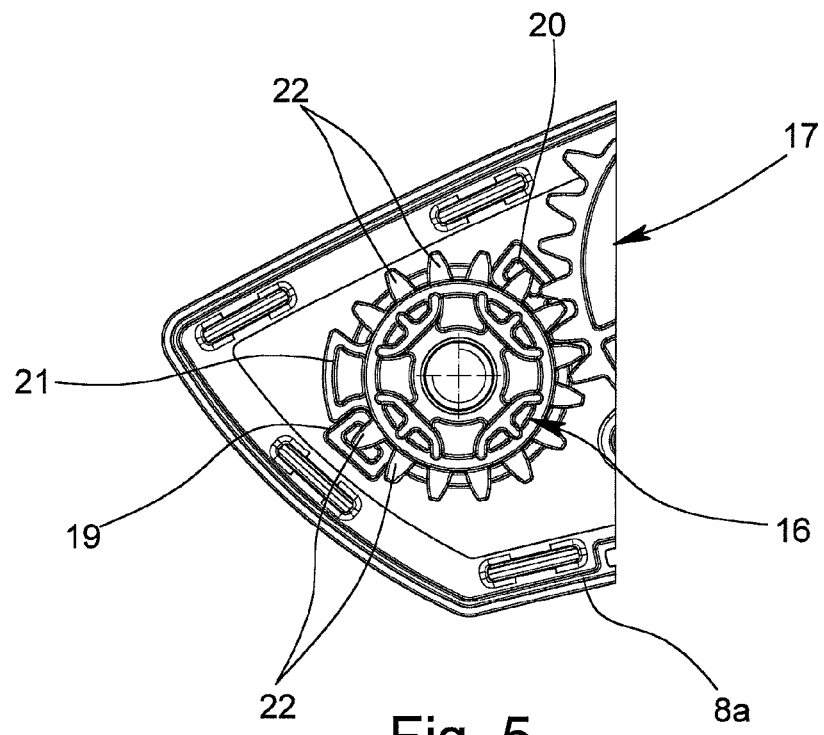
FIG. 5 shows an enlarged extract of the fastening part according to FIG. 4.
Figure 6:
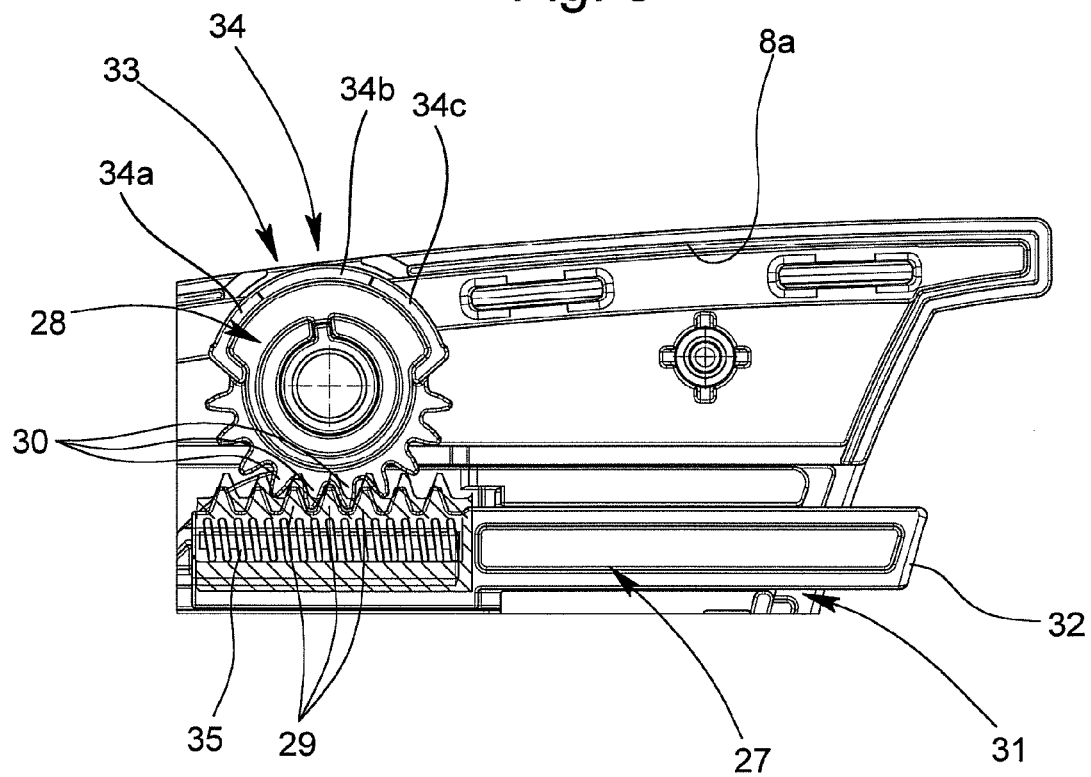
FIG. 6 shows another enlarged extract of the fastening part according to FIG. 4.

It is especially apparent from FIGS. 4 and 5 that, in the housing 8 of the fastening part 4, two stops 19, 20 are made which interact with a corresponding counter stop 21 molded on the first gear wheel 16 such that the gear wheel 16 and thus also the handle 5 can be turned at maximum by roughly 90°. In the base position of the unlocking element 15 shown in FIGS. 4 and 7 in which the handle 5 is not turned, the counter stop 21 which is made on the first gear wheel 16 with its one face adjoins the first stop 19. In the third position of the unlocking element 15 which is shown in FIG. 9 and in which the handle 5 is turned by roughly 90° compared to the base position, the counter stop 21 of the first gear wheel 16 with its second face adjoins the second stop 20. The arrangement and execution of the two stops 19, 20 and of the counter stop 21 thus fixes the maximum angle of rotation of the handle 5, the two end positions corresponding to defined positions of the unlocking element 15.

Figure 7:
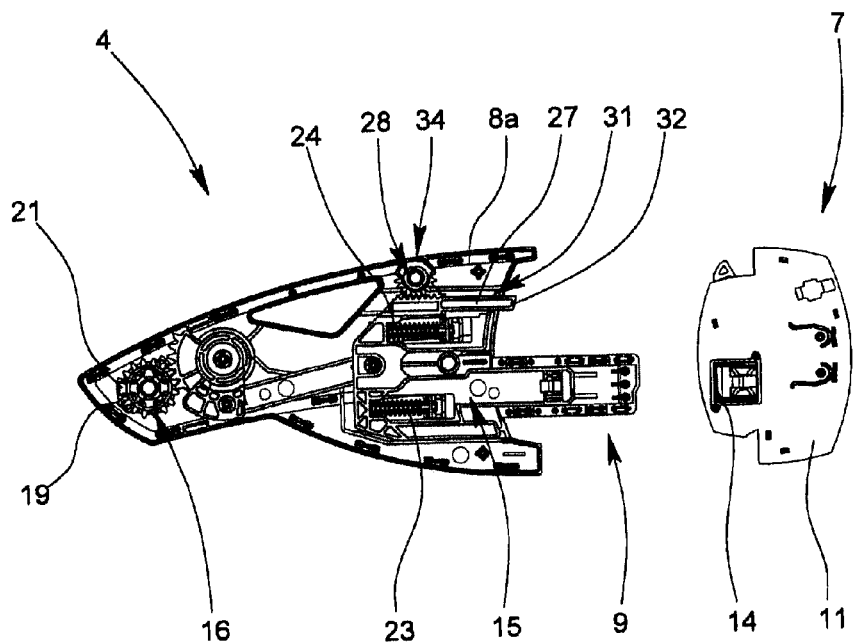
FIG. 7 shows a mounting clip of the modular terminal block according to FIG. 2 and the fastening part according to FIG. 4, not slipped on, FIG. 8 shows the mounting clip and the fastening part in the slipped-on state, in the first unlocking position.

Moreover, it can be recognized from the representation according to FIG. 4 that the execution of the first stop 19 in the housing 8 as well as the arrangement of the counter stop 21 on the gear wheel 16 prevents the test plug block 1 from tilting unintentionally clockwise due to its own weight when a technician is holding the test plug block 1 in place with one hand on the handle 5 and guiding it according to FIG. 7 horizontally in the direction of the modular terminal block 2.

So that, in the intentional turning of the handle 5 and thus also of the gear wheel 16 out of the base position shown in FIG. 7 into the position shown in FIG. 9 and back into the second unlocking position shown in FIG. 10, the teeth 22 of the gear wheel 16 do not strike the stops 19, 20 in the housing 8, the two stops 19, 20 and the counter stop 21 are located in a first plane and the teeth 22 of the gear wheel 16 are located in a second plane, the first plane being offset relative to the second plane in the direction of the axis of rotation of the gear wheel 16. As is apparent from FIG. 5, in this way, the teeth 22 of the first gear wheel 16 can be guided past the two stops 19, 20.

Moreover, it can be recognized from FIG. 4 and FIGS. 7 to 10 that there are two compression springs 23, 24 in the housing 8 of the actuating part 4, the two compression springs 23, 24 each having one end supported on a stop 25 on the unlocking element 15 and their other end supported on a bearing section 26 in the housing section 8. The compression springs 23, 24, which are three-dimensionally integrated into the unlocking element 15, apply a spring force to the unlocking element 15 which presses the unlocking element 15 in the direction of its base position, i.e., in the representation according to FIG. 4 to the left. When the handle 5 is turned out of the position shown in FIG. 7 into the two positions according to FIG. 8 and FIG. 9, a force must be thus applied which is greater than the spring force of the two compression springs 23, 24. When the unlocking element 15 is moved out of the position according to FIG. 7 into the position according to FIGS. 8 and 9, i.e., to the right relative to the housing 8, the compression springs 23, 24 thus must be compressed.

To indicate the plug-in and locking state of the test plug block 1 and thus to indicate the position of the plug-in section 9 of one fastening part 4 in the clip housing 11 of a mounting clip 7, the preferred embodiment of the fastening part 4 which is shown in the figures has a position indication. As can be recognized in turn from FIG. 4 and FIGS. 7 to 10, and in particular from the enlargement according to FIG. 6, the position indication is formed of a position rod 27 which is located movably on the unlocking element 15 and a position wheel 28 which is pivotally mounted in the housing 8. Here, a section of the position rod 27 which is provided with teeth 29 engages a section of the position wheel 28 which is provided with corresponding teeth 30 so that a horizontal movement of the position rod 27 leads to a corresponding turning of the position wheel 28. The position rod 27 is located relative to an opening 31 made in the unlocking element 15 such that the free end 32 of the position rod 27 which points in the slip-on direction of the test plug block 1 protrudes through the opening 31 when the test plug block 1 has not been slipped onto the modular terminal block 2.

Conversely, if the test plug block 1 has been slipped onto the modular terminal block 2 (FIG. 8), the free end 32 of the position rod 27 is pressed back by the top edge of the mounting clip 7 into the unlocking element 15; at the same time this leads to turning of the position wheel 28. Since a viewing window 33 is made in the housing 8 of the fastening part 4 opposite the position wheel 28, the indication section 34 which is opposite the teeth 30 can be easily recognized through the viewing window 33 from the outside for the technician. So that the position rod 27 when not slipped on always protrudes out of the opening 31 with its free end 32, a spring element 35 is arranged in the unlocking element 15 such that the position rod 27 is pressed by the spring element 35 in the direction of the opening 31.

The indication section 34 of the position wheel 28, for this purpose, preferably has at least three markings 34a, 34b, 34c (FIG. 6) which can be, for example, different color markings or different numbers or letters. The first marking is then located in the region of the viewing window 33 when the plug-in section 9 of the fastening part 4 is not plugged in the clip housing 11 of a mounting clip 7 or at least not latched in it so that it can be pulled completely out of the clip housing 11. The second marking can be recognized through the viewing window 33 when the plug-in section 9 of the fastening part is fully plugged in the clip housing 11 of the mounting clip 7. If the plug-in section 9 of the fastening part 4 is in its second latching position, the third marking is located in the region of the viewing window 33.

It will be briefly explained again below based on FIGS. 7 to 10 which positions and states the fastening part 4 has when the test plug block 1 is being slipped onto a modular terminal block 2 and removed from it.

In the base position, which is shown in FIG. 7, the handle 5 is not turned so that the unlocking element 15 is likewise pushed into its base position, to the left, due to the spring force of the two compression springs 23, 24. Since the counter stop 21 adjoins the stop 19, tilting of the front of the test plug block 1 clockwise due to its own weight is prevented so that the test plug block 1 can be easily held by the technician with one hand on the handle 5 and can be guided in the direction of the modular terminal block 2. The position rod 27 is pressed by the spring force of the spring element 35 in the direction of the opening 31 so that the free end 32 of the position rod 27 protrudes out of the opening 31.

The position wheel 28 is turned such that the first (middle) marking of the indication section 34 can be recognized through the viewing window 33.

FIG. 8 shows the fastening part 4 in the position when the test plug block 1 has been slipped fully onto the modular terminal block 2 and moreover the handle 5 has been turned by an angle α of roughly 30°. By turning the handle 5 the unlocking element 15 is in its first unlocking position in which it has been pushed somewhat to the right so that the unlocking element 15 releases the locking of the first latching position. To do this the corresponding opposed latching element in the clip housing 11 of the mounting clip 7 is deflected somewhat by the unlocking element 15 so that the corresponding latching element 12 on the plug-in section 9 no longer latches to the opposed latching element. Since the fastening part 4 is seated on the mounting clip 7, the free end 32 of the position rod 27 is pressed back into the unlocking element 15 so that the position wheel 28 is turned clockwise by the movement of the position rod 27. At this point the second (top) marking of the indication section 34 is visible through the viewing window 33.

In the position of the test plug block 1, which is shown in FIG. 9, the handle 5 is turned farther by an angle β of roughly 60° so that the unlocking element 15 is in its third position. In this position, the unlocking element 15 has been moved to the maximum degree relative to the housing 8. Since the bottom edge of the unlocking element 15 in the first unlocking position according to FIG. 8 is already seated on the top of the clip housing 11 of the mounting clip 7, the turning of the handle 5 by the angle β leads to the housing 8 of the fastening part 4 being repelled to the left away from the clip housing 11. Further removal of the fastening part 4 and of the test plug block 1 is prevented by the locking of the second latching position which has not yet been released in this position. Since at this point the counter stop 21 adjoins the stop 20, further rotation of the handle 15 is prevented. The maximum movement of the unlocking element 15 relative to the housing 8 likewise moves the position rod 27 to the maximum degree to the right relative to the housing 8 due to the spring force of the spring element 35 so that the position wheel 28 at this point is turned counterclockwise to the maximum degree. The third (bottom) marking of the indication section 34 is visible through the viewing window 33.

Finally, FIG. 10 shows the fastening part 4 in the second unlocking position in which the handle 5 is again turned back into the base position. The counter stop 21 on the gear wheel 16 adjoins the first stop 19. The unlocking element 15 is at this point again moved to the left into the housing 8, the unlocking element 15 releasing the locking of the first latching position. In doing so the opposed latching element 14 which is made as a latching clip in the clip housing 11 of the mounting clip 7 is deflected somewhat by the unlocking element 15 so that the corresponding latching element 13 on the plug-in section 9 no longer latches to the opposed latching element 14. The test plug block 1 can at this point be completely removed from the modular terminal block 2. With the unlocking element 15 the position rod 27 is also moved again into the housing 8 so that the position wheel 28 turns again clockwise into its initial position in which the first (middle) marking of the indication section 34 can be recognized through the viewing window 33.

What is claimed is:

1. A test plug block for slipping onto a modular terminal block, comprising,
   a plurality of interconnected test plugs, and
   two fastening parts which are located on either side of the plurality of test plugs and which are connected to one another via a handle, each of the fastening parts having a housing with a plug-in section which is adapted for being plugged into a receiving section in a clip housing of a mounting clip of the modular terminal block,
   wherein the plug-in section of at least one of the fastening parts has at least two latching elements which is adapted to fix a first latching position and a second latching position of the at least one fastening part in the mounting clip together with corresponding opposed latching elements of the mounting clip, the two latching positions being arranged behind one another in a slip-on direction of the test plug block,
   wherein an unlocking element is movably arranged in the housing of said at least one fastening part, the unlocking element being movable by a rotary motion of the handle out of a base position into a first unlocking position and into a second unlocking position,
   wherein, in the first unlocking position, the locking of the first latching position being released by the unlocking element, and in the second unlocking position, the locking of the second latching position being released by the unlocking element, and
   wherein the at least one fastening part has at least one limiting element which limits the extent to which the handle is rotatable relative to the housing.

2. The test plug block as claimed in claim 1, wherein there is a gear train arrangement in the housing of the at least one fastening part via which the unlocking element is connected to the handle.

3. The test plug block as claimed in claim 2, wherein the gear train has two gear wheels which engage one another and a connecting rod, the first gear wheel being connected to the handle and the connecting rod being connected at one end to the second gear wheel and at an opposite end to the unlocking element.

4. The test plug block as claimed in claim 3, wherein, in the housing of the at least one fastening part, at least one stop is provided as said limiting element, wherein the at least one stop interacts with a corresponding counter stop on one of the first gear wheel and the second gear wheel for limiting rotation of the handle relative to the housing.

5. The test plug block as claimed in claim 4, wherein said at least one stop and the counter stop which are located in a first plane and teeth of the gear wheel are located in second plane which is offset relative to the first plane in a direction of an axis of rotation of the gear wheel.

6. The test plug block as claimed in claim 4, wherein, in the housing of at said least one fastening part, two stops are provided which interact with the corresponding counter stop for limiting rotation of the handle relative to the housing to a rotary motion of less than 180°.

7. The test plug block as claimed in claim 6, wherein the unlocking element in the housing of at least one fastening part is movable out of a base position into the first unlocking position by rotating the handle by an angle α in a first direction, wherein the unlocking element can be moved further into a third position by further rotation of the handle in the same direction by an angle β and by turning the handle back into the base position, the unlocking element can be moved into the second unlocking position, and wherein the counter stop in the base position of the unlocking element adjoins the first stop and in the third position of the unlocking element adjoins the second stop.

8. The test plug block as claimed in claim 1, wherein the unlocking element is located in the housing of at least one of the fastening parts such that the unlocking element is in the base position when the handle has not been actuated.

9. The test plug block as claimed in claim 8, wherein there is at least one spring element in the housing of the at least one fastening part, the at least one spring being arranged such that the unlocking element is moved into the base position by spring force of the spring element when the handle has not been actuated.

10. The test plug block as claimed in claim 9, wherein there are two compression springs in the housing of said at least one fastening part, each of the two compression springs has one end supported on a stop on the unlocking element and an opposite end on a bearing section in the housing.

11. The test plug block as claimed in claim 1, wherein in the housing of at least one fastening part there is a position indicator which indicates a respective position of the plug-in section of the fastening part in the clip housing of a mounting clip.

12. The test plug block as claimed in claim 11, wherein the position indicator has a position rod which is movably arranged on the unlocking element parallel to the slip-on direction of the test plug block and a position wheel which is pivotally mounted in the housing, a section of the positioning rod is provided with teeth which engage teeth on a section of the position wheel, wherein an opening is in the unlocking element through which a free end of the position rod can protrude, and wherein a viewing window is provided in the housing of the fastening part through which an indication section of the position wheel is visible from outside of the housing.

13. The test plug block as claimed in claim 12, wherein a spring element is arranged in the housing of the fastening part such that the position rod is exposed to a force by the spring element in a direction of the opening in the unlocking element.

14. The test plug block as claimed in claim 12, wherein the indication section of the position wheel has at least three different markings which are assigned to different positions of the plug-in section of the fastening part in the clip housing of a mounting clip.

15. The test plug block as claimed in claim 1, wherein a plug-in cycle counter is provided in the housing of the at least one fastening part, the plug-in cycle counter displaying the number of plug-in cycles that the test plug has been plugged into a modular terminal block.

* * * * *